(12) United States Patent
Malik et al.

(10) Patent No.: US 7,007,053 B1
(45) Date of Patent: Feb. 28, 2006

(54) AREA EFFICIENT REALIZATION OF COEFFICIENT ARCHITECTURE FOR BIT-SERIAL FIR, IIR FILTERS AND COMBINATIONAL/SEQUENTIAL LOGIC STRUCTURE WITH ZERO LATENCY CLOCK OUTPUT

(75) Inventors: Rakesh Malik, Uttar Pradesh (IN); Puneet Goel, Punjab (IN)

(73) Assignee: STMicroelectronics Asia Pacific (Pte) Ltd., Singapore (SG)

( * ) Notice: Subject to any disclaimer, the term of this patent is extended or adjusted under 35 U.S.C. 154(b) by 0 days.

(21) Appl. No.: 09/807,500

(22) PCT Filed: Oct. 13, 1998

(86) PCT No.: PCT/SG98/00082

§ 371 (c)(1),
(2), (4) Date: Apr. 13, 2001

(87) PCT Pub. No.: WO00/22729

PCT Pub. Date: Apr. 20, 2000

(51) Int. Cl.
*G06F 17/10* (2006.01)

(52) U.S. Cl. ..................................... 708/300
(58) Field of Classification Search ......... 708/300–323
See application file for complete search history.

(56) References Cited

U.S. PATENT DOCUMENTS

| | | | | |
|---|---|---|---|---|
| 4,752,905 A | * | 6/1988 | Nakagawa et al. | 708/629 |
| 4,982,354 A | * | 1/1991 | Takeuchi et al. | 708/319 |
| 5,262,972 A | * | 11/1993 | Holden et al. | 708/316 |
| 5,497,342 A | * | 3/1996 | Mou et al. | 708/708 |
| 5,692,020 A | * | 11/1997 | Robbins | 708/313 |
| 6,370,556 B1 | * | 4/2002 | Saramaki et al. | 708/319 |

FOREIGN PATENT DOCUMENTS

WO  WO 94/23493  10/1994

OTHER PUBLICATIONS

Dawood Alam et al, "VLSI Implementation of a New Bit-Level Pipelined Architecture for 2-D Allpass Digital Filters," *Institute of Electrical and Electronics Engineers*, 1: 724-727, Apr. 30-May 3, 1995.

K. Manivannan et al., "Minimal Multiplier Realization of 2-D All-Pass Digital Filters", *IEEE Transactions on Circuits and Systems*, 35(4):480-484, Apr. 1998.

* cited by examiner

*Primary Examiner*—Kakali Chaki
*Assistant Examiner*—Chat C. Do
(74) *Attorney, Agent, or Firm*—Lisa K. Jorgenson; Robert Iannucci; Seed IP Law Group PLLC

(57) ABSTRACT

An area-efficient realization of a coefficient block includes hardware sharing techniques and optimizations applied to this block. The block is connected to coefficient lines coming from a delay block to be connected to perform a filtering operation or a mathematical computing operation with optimization in hardware and provides a zero latency output. The coefficient block also enables an area minimal realization of digital filters based on the coefficient block, when operated in serial bit fashion. The optimization techniques and structure are good for bit-serial digital filters typically a finite impulse response (FIR) filter, including finite impulse response filter (IIR) and for other filters and applications based on combinational logic that includes delay elements, multipliers, and serial adders and/or subtractors.

11 Claims, 13 Drawing Sheets

BIT SERIAL ELEMENTS/COMPONENTS

UNIT DELAY

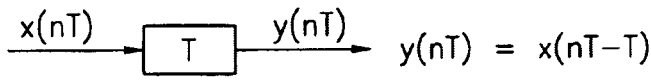

FULL ADDER

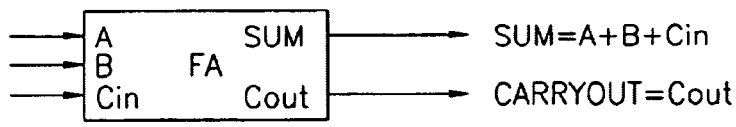

SUM = A+B+Cin

CARRYOUT = Cout

FIG. 2B

FULL SUBTRACTOR

DIFF = A−B−Cin

BORROW−OUT = Cout

FIG. 2C

SERIAL ADDER

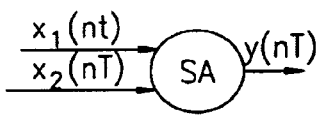

SERIAL SUBTRACTOR

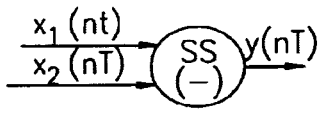

MULTIPLIER

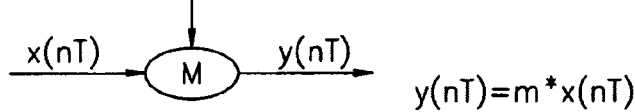

DELAY

INPUT FRAME SIZE = X BITS (E.G INPUT IS 1010101 OR X=7 BITS)

TO STORE X BIT FRAME, NUMBER OF T ELEMENT USED IN X OR 7 IN PRESENT CASE

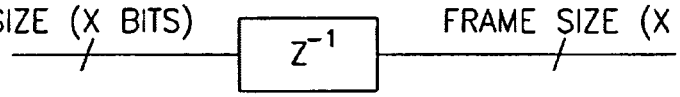

OR

UNIT DELAY

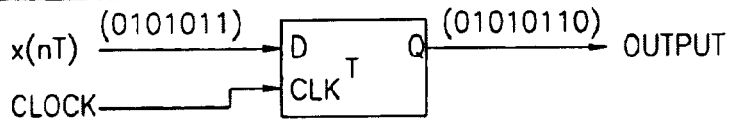

INPUT FRAME INPUT PATTERN (0101011) IS COMING SERIALLY AT x(nt) PIN AT CLOCK RATE SPECIFIED ON CLOCK PIN

*FIG. 3A*

FULL ADDER (FA) / FULL SUBTRACTOR (FS)

BINARY ADDITION/SUBTRACTION COMPONENTS IS REALIZED USING FOLLOWING TRUTH TABLE

TRUTH TABLE—FULL ADDER

| A | B | Cin | Z | Co |
|---|---|-----|---|----|
| 0 | 0 | 0   | 0 | 0  |
| 0 | 0 | 1   | 1 | 0  |
| 0 | 1 | 0   | 1 | 0  |
| 0 | 1 | 1   | 0 | 1  |
| 1 | 0 | 0   | 1 | 0  |
| 1 | 0 | 1   | 0 | 1  |
| 1 | 1 | 0   | 0 | 1  |
| 1 | 1 | 1   | 1 | 1  |

TRUTH TABLE—FULL SUBTRACTOR

| A | B | Cin | Z | Co |
|---|---|-----|---|----|
| 0 | 0 | 0   | 0 | 0  |
| 0 | 0 | 1   | 1 | 1  |
| 0 | 1 | 0   | 1 | 1  |
| 0 | 1 | 1   | 0 | 1  |
| 1 | 0 | 0   | 1 | 0  |
| 1 | 0 | 1   | 0 | 0  |
| 1 | 1 | 0   | 0 | 0  |
| 1 | 1 | 1   | 1 | 1  |

*FIG. 3B*

SERIAL ADDER (SA) / SUBTRACTOR (SS)

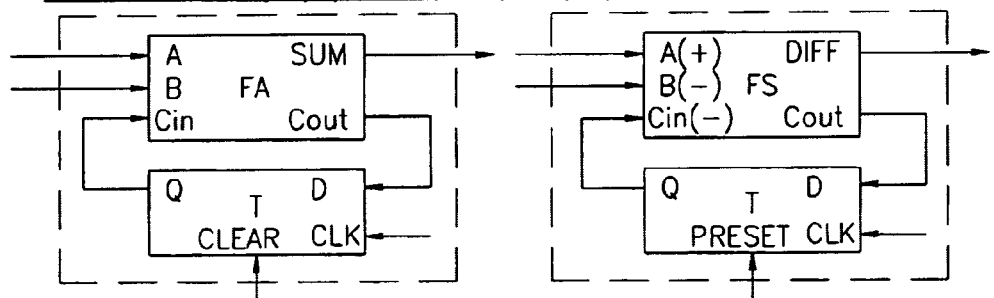

*FIG. 3C*

SERIAL MULTIPLIER(M)   m=331(INTEGER)

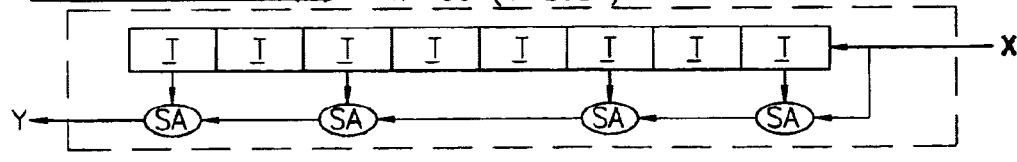

BIT MULTIPLIER COEFFICIENT SIZE IN THIS EXAMPLE IS 331 (BINARY 101001011)

*FIG. 3D*

IMPLEMENTATION 1
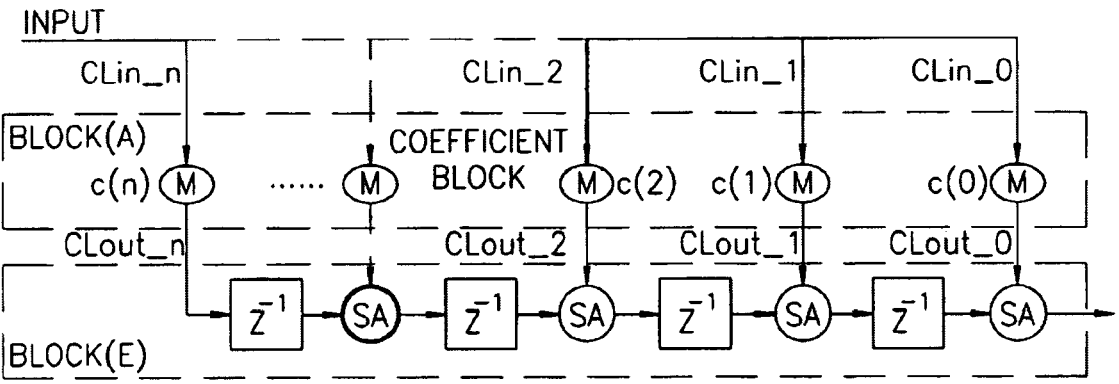
REALIZATION OF COEFFICIENT USING SHARE-ABLE
MULTIPLIER (COEFF.=3.11)
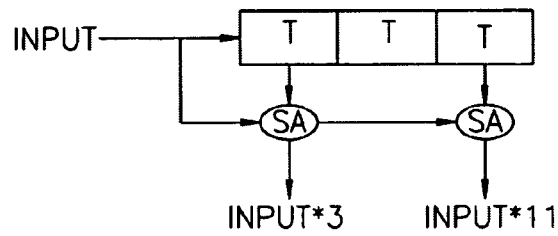
*FIG. 4A*
IMPLEMENTATION 2
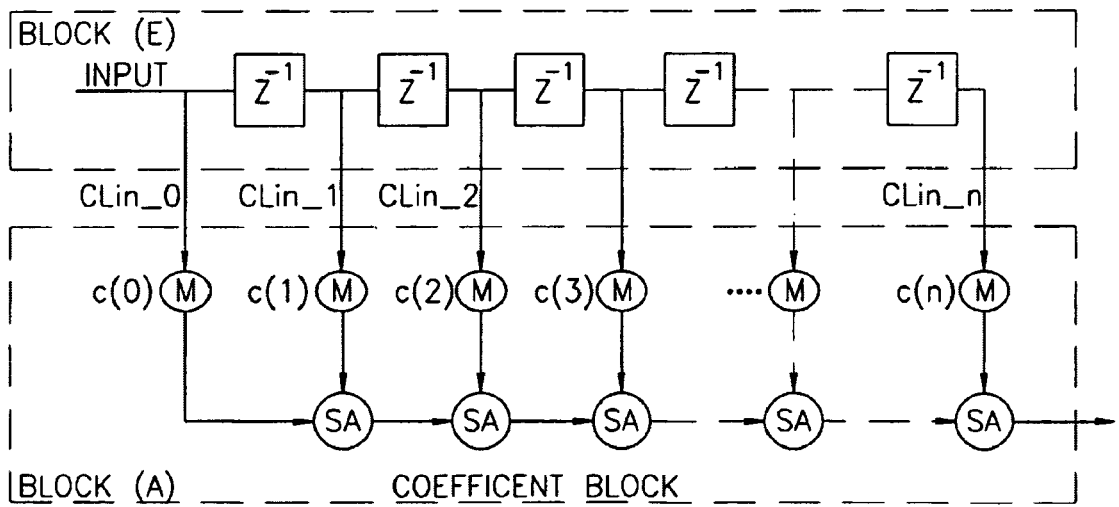
*FIG. 4B*

A) APPROX. NUMBER OF SA = NUMBER OF COEFFICIENT * (MAX COEFF SIZE /2)
B) FLIP-FLOP (T) ARE NOT SHARABLE
   APPROX. NUMBER OF FLIP-FLOPS - NUMBER OF COEFF * (MAX. COEFFICIENT SIZE /2)

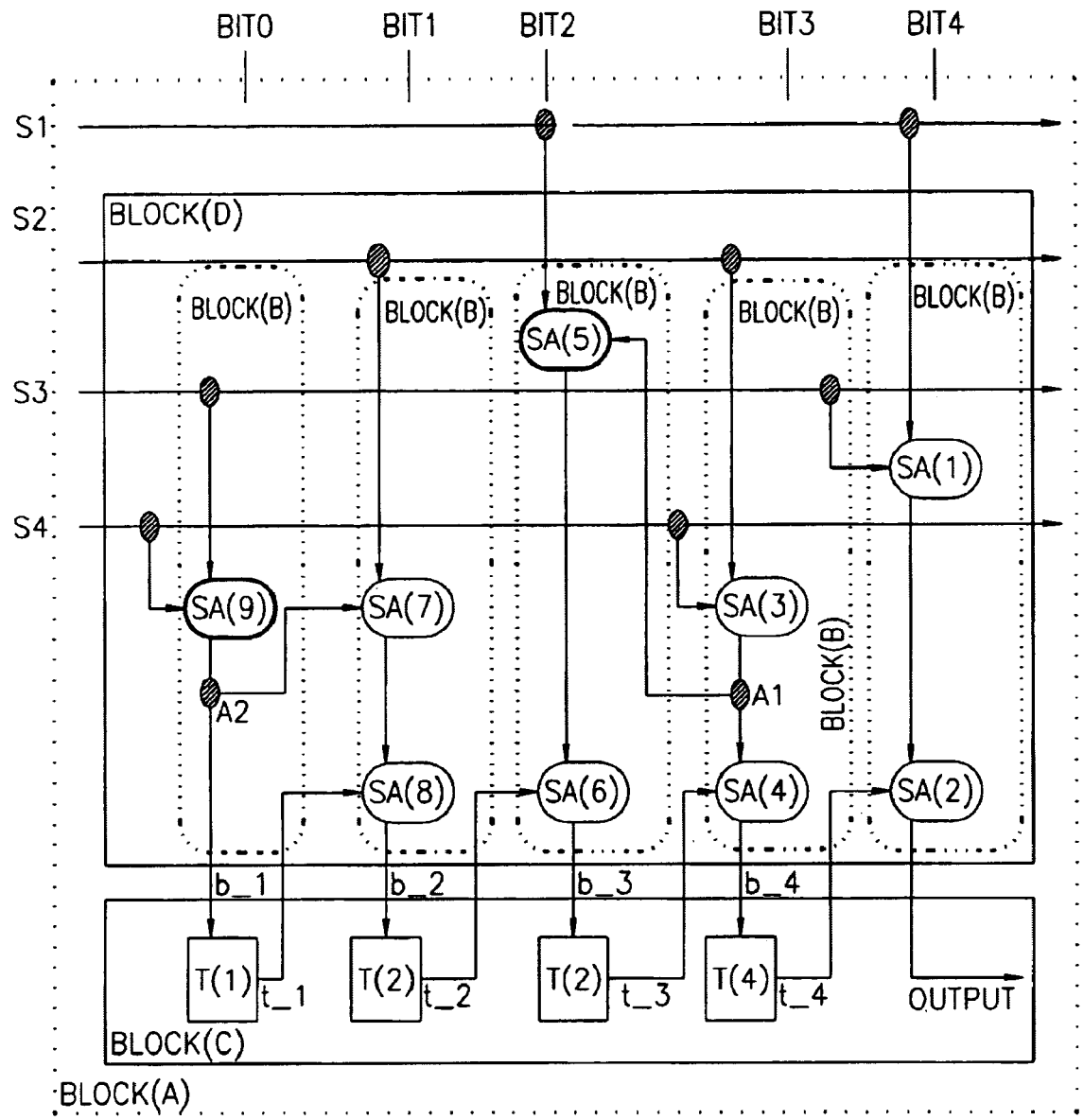
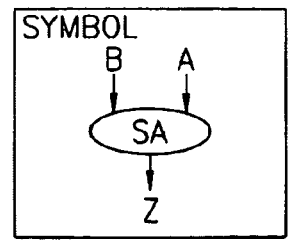
FIG. 9

AREA EFFICIENT REALIZATION OF COEFFICIENT ARCHITECTURE FOR BIT-SERIAL FIR, IIR FILTERS AND COMBINATIONAL/SEQUENTIAL LOGIC STRUCTURE WITH ZERO LATENCY CLOCK OUTPUT

BACKGROUND OF THE INVENTION

1. Field of the Invention

The invention relates to area efficient realization of coefficient block [A] or achitecture [A] with hardware sharing techniques and optimizations applied to this block. The block [A] is connected to coefficient lines CLin_0, CLin_1 . . . CLin_n and BLin_0, BLin_!, . . . BLin_n coming from block [E] and/or [F], to be connected to perform filtering operation or a mathematical computing operation with optimization in hardware and provides a zero latency output. The invention also gives the area minimal realization of digital filters based on coefficient block[A], when operated in bit serial fashion. The optimization techniques and structure of the present invention are good for bit-serial digital filters typically a finite impulse response(FIR) filter, infinite impulse response filter(IIR) and for other filters and applications based on combinational logic consisting of delay element(T), multiplier(M), serial adder(SA) and serial subtractor (SS).

2. Description of the Related Art

Details of Elements/Symbol Used in the Description

The basic components symbol used in design are shown in "FIG. 2" of the drawings. In addition, explanation and usages of the device are done in the text below and depicted in "FIG. 3" and "FIG. 4" of the drawings.

Unit Delay (T)

It is one bit delay element. It also performs function of a multiplier by a factor of 2. (e.g. For the serial input frame (0101011 in binary or 43 in integer representation), the output of this block is (01010110 in binary or 86 in integer representation). This element is usually a Flip-flop (D Flip-flop, J-K Flip-flop etc.).

Full Adder (FA)

It performs binary addition. The inputs to this element are A, B, Cin (Carryin) while the outputs are Z and Cout (Carryout). The truth table for full adder functionality is shown in "FIG. 3" of the drawings.

Full Subtractor (FS)

It performs binary subtraction. The inputs to this element are A, B, Cin (Carryin) while the outputs are Z and Cout (Carryout). The truth table for full subtractor functionality is shown in "FIG. 3" of the drawings.

Serial Adder (SA) and Serial Subtractor (SS)

It performs addition/subtraction of two serial frame, $x1(nT)$, $x2(nT)$ to generate output $y(nT)$ represented as $x1(nT)+x2(nT)$ or $x1(nT)-x2(nT)$. The serial adder (or subtractor) is implemented using a full adder (or subtractor) with a Flip-Flop as shown in "FIG. 3" of the drawings. The output Cout of [FA/FS] is delayed using the [T] element and is applied to Cin line of [FA/FS]. This enables the [FA/FS] and [T] together to function as serial adder (SA/SS), where A, B are the inputs to this element and Z is the output. (e.g of serial addition is as follows, if $x1(nT)=0110$ (6 in integer) and $x2(nT)=0111$ (7 in integer). Then $y(nT)=01101$ (13 in integer representation).

Serial Multiplier (M)

It multiplies two serial input frame $X(nT)$ and m. The output is function represented as $Y(nT)=X(nT)*m$. A serial coefficient multiplier(M) can be implemented by shift register using [T] elements and adder element [SA] (One shift means multiply by factor of 2). As shown in "FIG. 3" of the drawings, the multiplier is formed by adding the outputs corresponding to ones in the binary representation of the coefficient.

Delay ($Z^{-1}$)

Delay by one frame of data is done by shift register (series of Flip-flops (T) connected to store and shift the input frame). The number of Unit delay (T) in one delay element is equal to the frame size of the input.

The following description discusses the elements used for implementation of architecture and the existing implementations for digital filters. The proposed minimization is extendable to other applications such as Digital Signal Processing field and Digital designs.

From here onwards, all the illustration would be done with FIR filter which is extendable to other filters as described earlier. "FIG. 4" shows the existing structure of bit serial FIR filter with coefficient lines CLin_0, CLin_1 . . . CLin_n and the coefficient block [A] having the coefficients c(0), c(1), c(2), . . . c(n). The coefficient block is connected to delay element [$Z^{-1}$] and serial adders [SA] to form filter structure.

Stating the FIR filter equation in time and frequency domain $Y(n)=c(0)X(n)c(1)X(n-1)+c(2)X(n-2)+ \ldots c(n)X(0)$ $Y(z)=X(z)[c(0)+c(1)Z^{-1}+c(2)Z^{-2}+c(3)Z^{-3}+c(4)Z^{-4}+c(5)Z^{-5}+c(6)Z^{-6}+ \ldots +c(n)\ Z^{-n}]$ where X, Y are the input and output respectively and c(0), c(1) . . . c(n) represent the coefficients value which defines the characteristics of the filter and each delay [$Z^{-1}$] block represent sample delay of one. The filter equation can be implemented in two ways as shown in "FIG. 4" of the drawings In implementation 1, coefficient lines CLin_0, CLin_1, . . . CLin_n are common and connected to input X[n]. The output lines CLout_0, CLout_1 . . . CLout_n are connected to block [E], consisting of delay element [$Z^{-1}$] and serial adders [SA] elements. The structure makes easy realization of share-able multiplier in the coefficient block [A]. An example of share-able multiplier with coefficient values 3,11 is illustrated in "FIG. 4". The realization of these coefficient separately would require 4[T], 3[SA] elements. By virtue of CLin_0, CLin_1, . . . being common, the hardware is realized using 3[T], 2[SA] elements. Another feature of the structure is that the structure inherently requires more storage area, represented by [$-Z^{-1}$], as compared to implementation 2, since the storage is done after the multiplication. For input frame of n bit and coefficient of size m bit, the storage area of each delay element [$Z^{-1}$] is (m+n). The total storage space of the delay elements is (m+n)* (number of coefficients −1).

In implementation 2, the coefficient line CLin_0, CLin_1, . . . are not common. By virtue of connectivity of different input lines to all the coefficient elements [c(0), c(1).], the realization of coefficients block [A] using share-able elements is not present. Another feature of this structure is that it inherently requires lesser storage space, represented as [$Z^{-1}$], unlike in previous implementation, here the storage is done before multiplication. For input frame of m bit and coefficient of size n bit, the storage area of each delay element $[Z^{-1}]$ is (m). The total storage space is (m)*(number of coefficients −1).

The invention is proposed in reducing the area of the coefficient block [A] and have share-able elements in coefficients, even if the coefficient lines CLin_0, CLin_1 . . . are not commonly connected. For existing configuration as shown in "FIG. 7" and "FIG. 8", the share-ability of hardware in block [A] is a limitation.

Also, as described in previous section, implementation 2 is area efficient with respect to implementation due to reduced delay elements size. Over and above this by having share-able multiplier or reduced coefficient block [A], which are the key features of the invention, implementation 2 becomes still more area-efficient. This reduction is extendable to other filter based on coefficient block [A], as stated in the first section. The present invention operates on integer valued coefficient.

Further, to quote Norsworthy and Crochiere (Delta-Sigma Data Converters IEEE press pp-435, copyright 1997).

"Bit-serial architecture reduce the interprocessor communication down to 1 bit. Generally the number of processors is very large, but because each processor is so small, the overall economy is very high. Bit serial architectures are usually most effective for filters having a few state variables, such as IIR filters and the wave-digital filters. For this reason, bit-serial techniques are less frequently applied to FIR structures, especially when the filter length is relatively long . . . ".

However, the present invention applies optimization techniques for reducing the area in large sized coefficients by applying a number of optimizations in FIR/IIR filter structures.

To elaborate the applicant's optimization techniques, consider a FIR filter with coefficient as 5, 14, 25, 30, 25, 14, and 5. Though the size of the coefficients in this example is small, it is enough to elaborate the minimization proposals. In most of the practical cases, the coefficients are symmetrical.

Stating the FIR filter equation in time and frequency domain $$Y(n)=c(0)X(n)+c(1)X(n-1)+c(2)X(n-2)+ \ldots c(n) X(0)$$

$$Y(z)=X(z)[c(0)+c(1)Z^{-1}+c(2)Z^{-2}+c(3)Z^{-3}+c(4)Z^{-4}+c(5)Z^{-5}+c(6)Z^{-6}+ \ldots +c(n) Z^{-n}]$$

where X, Y are the input & output respectively and c(0), c(1) . . . c(n) represent the coefficients value.

Using the coefficient values in above equation $$Y(n)=5X(n)+14X(n-1)+25X(n-2)+30X(n-3)+25X(n-4)+14X(n-5)+5X(n-6)$$

$$Y(z)=X(z)[5+14Z^{-1}+25Z^{-2}+30Z^{-3}+25Z^{-4}+14Z^{-5}+5Z^{-6}] \quad (EQ\ 1)$$

The Existing Method and Minimization

"FIG. 5" of the drawings shows FIR filter structure of implementation 2. The figure illustrates the realization of FIR filter represented by "Equation I".

In one of the known optimization technique, is taken advantage of the symmetry in the coefficients. The streams which have to be multiplied with the same coefficients can be added first and then multiplied. For a large filter structure, this leads to a reduction by 45% in the coefficient block. (see "FIG. 6" of the accompanying drawings).

This is done by restructuring the equation as under:

$$Y(z)=X(z)[5*(1+Z^{-6})+14*(Z^{-1}+Z^{-5})+25*(Z^{-2}+Z^{-4}) +30*Z^{-3}] \quad (EQ\ 2)$$

For the rest of the optimization proposals it will be talking about only the multiplier adder series which is shown in the dotted box referred to as coefficient block [A]. "FIG. 7" of the drawings shows the traditional way of implementation of the example structure for block [A], wherein S1 to S4 represent the lines connected to delay block $[Z^{-1}]$ through line CLin_0 to CLin_6 depicted in "FIG. 6" of the drawings. The Lines S1 to S4 are separately connected to [T] element for performing a multiplication by a factor of 2 and (SA) is being used to perform serial addition of data. This represents the multiplier less realization of filter coefficient block (A) where the property of flip-flop (T) as multiplier of factor of two is used.

Mathematically, the restructured equation according to the structure is stated as $$Y(nT)=(4+1)S1+(8+4+2)S2+(16+8+1)S3+(16+8+4+2)S4 \quad (EQ\ 3)$$

In this implementation, S1, S2, S3, S4 lines are not commonly connected. Hence this restricts to achieve a share-able hardware in coefficient block [A]. Thus all the function/operations of this block represent unique hardware. The elements required by the terms are listed as First term=2[T], 1 [SA]
Second term=3[T], 2[SA]
Third term=4[T], 2[SA]
Fourth term=4[T], 3[SA]

Final addition of all the four term would require 3[SA].

The generalized structure of "The Existing Method and Minimization" is depicted in "FIG. 8". In the structure, each column represents a coefficient value. The [T] elements, shown as T1_1 to T1_m in column 1, defines connectivity with line S1. In similar fashion, [T] elements, shown as Tn_1 to Tn_m in column n, defines the connectivity with line Sn.

The presence of one of the elements in columns 1 to n (i.e T1_1 to T1_m, T2_1 to T2_m . . . Tn_1 to Tn_m) is determined by coefficient value. Thus depending on coefficient value on lines S1 to Sn, the number of [T] element in a column is determined. Also the number of serial adders/subtractor [SA/SS] in columns is represented as (SA1_1 to SA1_m, SA2_1 to SA2_m . . . SAn_1 to SAn_m). The presence of one of these elements is again defined by the coefficient value.

In the structure, the [T] elements are arranged in shift register form. The input to first [T] element is connected to one of the S line. While the input to $\mu$M SS] is connected from input S1 to Sn and/or one of the output of [T] elements of shift register, depending on the coefficient value. Finally, using SAe_1 to SAe_n-1 elements, the addition/subtraction of [SA/SS] of all the coefficient terms depicted in columns is done. The final output is the output of last addition/subtraction[SA/SS].

Among the lines S1 to Sn, the [T] elements are not share-able and also the [SA] in each column are also not share-able. Thus limited minimization is possible in this structure.

Minimization (Already Applied as Patent)

This structure reduces the hardware of the coefficient block [A] by having shareable elements in coefficients, even if the coefficient lines CLin_0, CLin_1 . . . are not commonly connected. This structure reduces the area by approximately 30–50% of "FIG. 7" of the drawings by reducing the number of components and by having share-ability of components.

Here the optimization techniques are illustrated with examples and end of this section depicts the generalized equation and structure of the device.

Continuing the same example of FIR filter and using "Equation 3" of previous section.

$$y(nT)=5*S1+14*S2+25*S3+30*S4$$

$$Y(nT)=(4+1)S1+(8+4+2)S2+(16+8+1)S3+(16+8+4+2)S4$$

The applicants proceed to share the shift registers (multiply by 2) of the design.

$$=(S3+S4)*16+(S2+S3+S4)*8+(S1+S2+S4)*4+(S2+S4)\\*2+(S1+S3)=(S1+S3)+2*(S2+S4+2*\\(S1+S2+S4+2*(S2+S3+S4+2*(S3+S4)))) \text{ (EQ 4)}.$$

Finding out the common additive factors $$A1=S2+S4$$

$$A2=S3+S4$$

The "Equation 4" can be further reduced as $$y(nT)=(S1+S3)+2*(A1+2*(S1+A1+2*(S2+A2+2*A2)))$$
(EQ 5)

The implementation flow for this equation and the hardware implementation is illustrated here, also the hardware implementation in shown in "FIG. 9" and "FIG. 10" of the drawings [e.g SA(1), SA(2) etc. are used for representing adders, T(1), T(2) etc. are used for representing the unit delay]. In the flow of implementation, S1, S2, S3, S4 represents four inputs. The primary addition is done using serial adders SA(1), SA(3), SA(9) representing addition of terms S1+S3, S2+S4, S3+S4. While the secondary and tertiary addition is done using the adders SA(5), SA(7), SA(8), SA(6), SA(4), SA(2). The multiplication by factor of two is done using the elements T(1), T(2), T(3), T(4).

Implementation Flow of Equation

Implementation of hardware is shown in "FIG. 9" of the drawings, wherein the input line S1 to S4 represent the lines connected to delay block [Z⁻¹] through coefficient line Clin_0 to CLin_6 depicted in "FIG. 6" of the drawings. The Lines S1 to S4 are connected to block [B] for performing the serial addition/subtraction, for which (SA), (SS) elements are used within block[B]. The output of each block [B] is terminated with a [T] block, which represents the block [B] output being multiplied by a "factor of 2". The output b_1 of block [B] which is at bit position 0 is fed to the input of the T(1), in turn the output line t_1 of element [T(1)] is fed to next section of block[B]. Thus all addition defines a bit position before getting multiplied by 2 and changing to next bit position. All [T] 1 elements are represented by block[C]. In the structure, the flip-flop [T] representing multiplication by a "factor of 2", is pushed to share between various coefficient values. Hence reducing the number of flip-flop(T).

In the minimization of "FIG. 9" of the drawings, approximate area calculations is =9 serial adder+4 T=22 Units, whereas the area calculation of "FIG. 7" of the drawings is 11 serial adder+13 T=35 units. (assuming 1 Unit=1 FA=2HA=IT & serial adder=2 Units). This resulted in 37% saving in area (13/35*100).

BRIEF SUMMARY OF THE INVENTION

The invention relates to an area-efficient realization of a coefficient block with hardware sharing techniques and optimizations applied to this block. The block is connected to coefficient lines coming from a delay block to be connected to perform a filtering operation or a mathematical computing operation with optimization in hardware and provides a zero latency output. The invention also gives the area minimal realization of digital filters based on the coefficient block, when operated in serial bit fashion. The optimization techniques and structure of the present invention are good for bit-serial digital filters typically a finite impulse response (FIR) filter, including finite impulse response filter (IIR) and for other filters and applications based on combinational logic that includes delay elements, multipliers, and serial adders and/or subtractors.

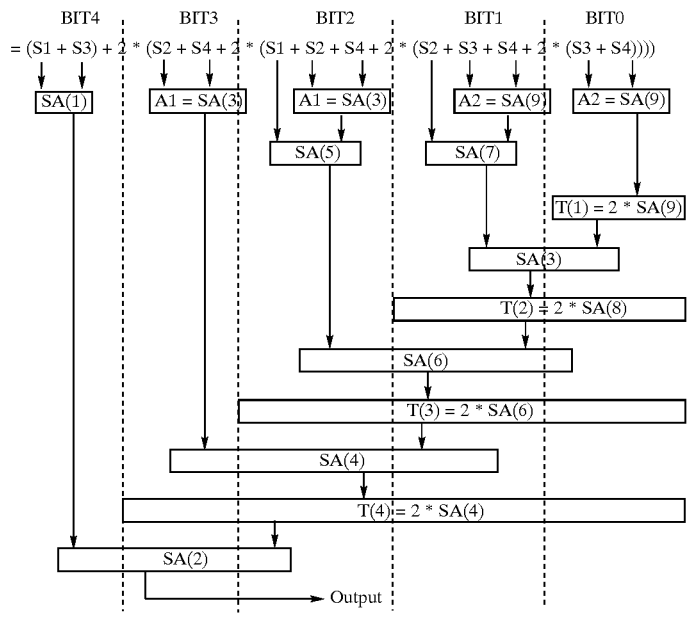

BRIEF DESCRIPTION OF THE SEVERAL VIEWS OF THE DRAWINGS

FIGS. 2A–2G show the symbol of components used in the device.

FIGS. 3A–3D show the description of components used in the device.

FIGS. 4A–4B show bit-serial FIR filter implementations.

FIG. 9 shows the minimization technique involved in a FIR filter.

DETAILED DESCRIPTION OF THE INVENTION

Minimization Proposed in the Present Invention

Figure 1A:
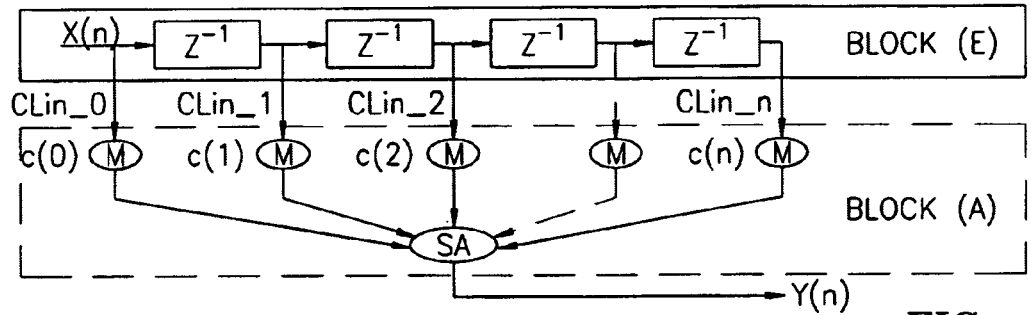
FIGS. 1A–1C show the field of the invention and applications of the device.
Figure 1B:
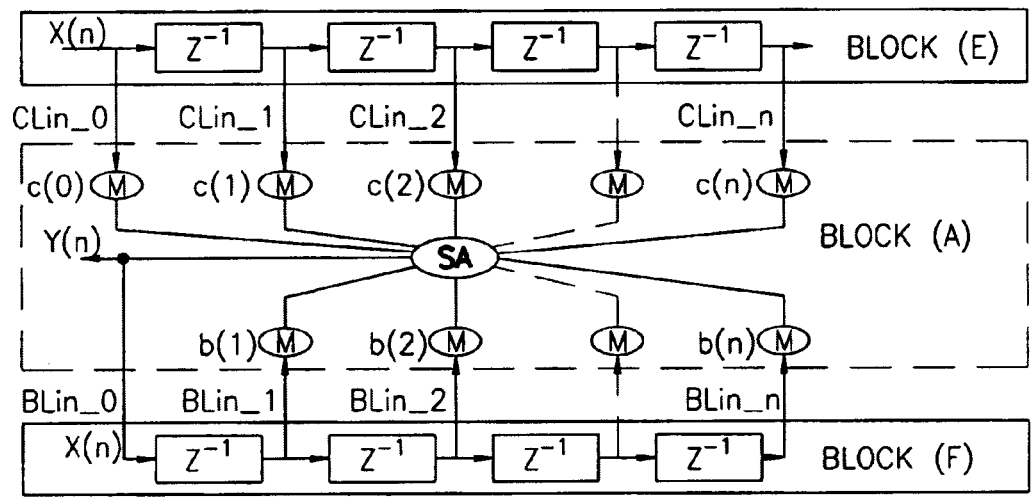
Figure 1C:
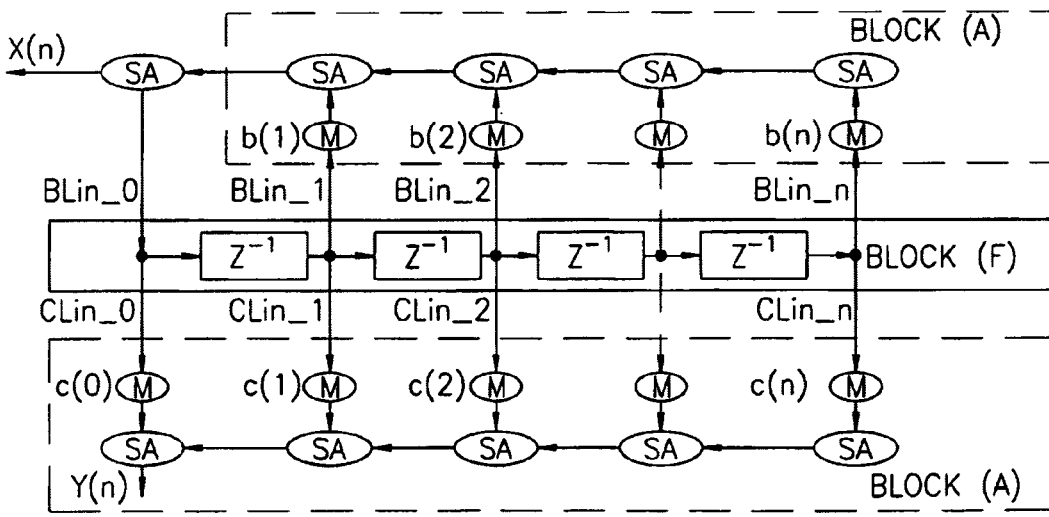
Figure 5:
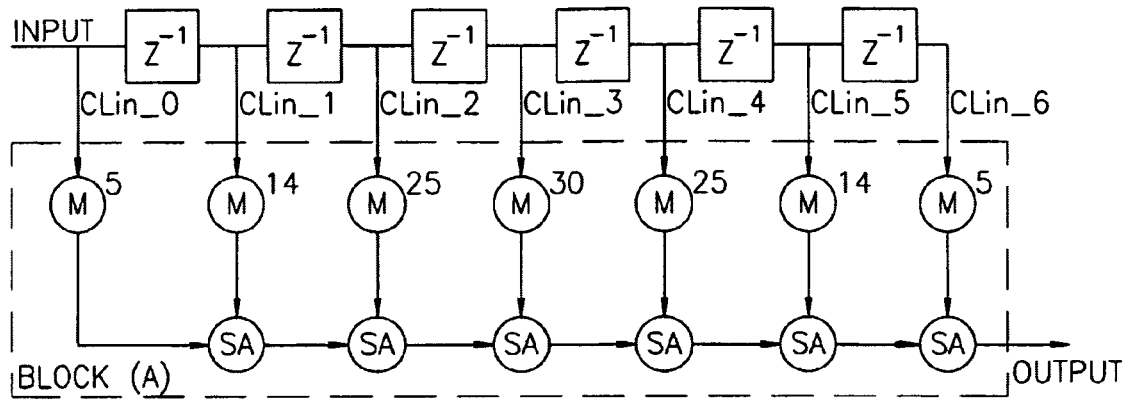
FIG. 5 shows an example of a FIR filter.

The invention reduces the area of the coefficient block [A] by having share-able elements in coefficients, even in the implementation where the coefficient lines CLin_0, CLin_1 . . . are not commonly connected (shown as architecture [A]). This coefficient block [A] when applied in implementations ("FIG. 4") of FIR filter, makes it still more area-efficient. This reduction is extendable to other filter based on coefficient block [A], as stated in the first section.

An area efficient implementation of filter coefficient block is done using full adder (FA) block instead of serial adder (SA). It is known that a serial adder consists of one full adder (FA) and one flip-flop (T) element. (refer "FIG. 3" of the drawings). This makes serial adder(SA) twice expensive in area as compared to one full adder(FA) block. [area of serial adder (SA)=1 FA+1T=2 units while the area of 1FA=1 unit]. In this implementation the reduction in area of the coefficient block [A] is achieved by maximising the use of full adder (FA) i.e by replacing serial adders (SA) with Full adders (FA) in the block [A].

The above is achieved by providing a device for area efficient realization of coefficient, said device comprising architecture [A] with hardware sharing techniques and optimization applied to this architecture, the architecture [A] is connected to coefficient lines CLin_0. CLin_1 . . . CLin_n and/or BLin_0, BLin_1, . . . BLin_n coming from block [E] and/or [F], to be connected to perform filtering operation or a mathematical computing operation with optimization in hardware and provides a zero latency clock output, the serial input bit line of said architecture [A] are S1, S2 . . . Sn. [where n represents the number of coefficients of the filter], the addition terms of the equation [(a0*S1+b0*S2+ . . . +k0*Sn), (a1*S1+b1*S2+ . . . +k1*Sn) . . . (am*S1+bm*S2+ . . . +km*Sn)] are represented as blocks [B], the said block [B] is a combinational block consisting of full adders (FA) & full subtractor (FS) elements, the values a0, b0 . . . etc. are (+/−1 or 0), the connection of elements (FA/FS) to S1, S2 . . . Sn lines and interconnection of the elements (FA,FS) depend on the value of coefficients, the final output of last element [FA/FS] of each block [B] is terminated through lines b_1, b_2, . . . b_m at [T] elements, the number of T elements in cluster [C] depends on the size of maximum coefficient value and is share-able for all the coefficient in the coefficient architecture [A], in the said architecture all the combinational elements [B] are clustered together as [D] and all the unit delay elements {T[1], T[2]. T[m]} are clustered together in [C], thereby separating the sequential and combinational logic, In the said architecture [A] the output of element [T] is connected to the one of the inputs of combinational logic of block [B] of next bit position, the interconnections from cluster [C] to [B] is represented as t_1, t_2, . . . t_m, the elements [FA/FS] are arranged in matrix form FA0_0 to FA0_n in bit position 0, FA1_1 to FA1_n in bit position 1, . . . . FAm_1 to FAm_n in bit position m whose presence is defined by coefficient value, the carry-out pin of full adder (FA) of each cluster stage [B] in the said architecture [A] is fed to input of full adder (FA) of previous stage cluster [B] i.e stage preceding the flip-flop (T) element of cluster [C], in this way the same Flip-Flop [T] (T1, T2, T3 . . . Tn) is used for multiplication by "a factor of two" and also in the implementation of the carry structure in the one bit serial adder, in the said architecture some extra components represented as block [Ex] are being used for connecting the carryout of all the adders/subtractors [FA/FS] of last stage of [D], the element [FA/FS] and [T] are used within this block, and hence, the said architecture [A] structures the circuit into sequential block [C] consisting of [T] elements and combinational [D] consisting of [FA,FS] elements, while the [T] elements of block [C], are common for all the coefficients and are share-able and positioned at end position of each block [B], the Block [D] has combinational element block[B] which are essentially [FA,FS], thereby making share-able hardware within block [D] and the final output is the output of BITm position.

In the present device, preferably, the area minimal realization of digital filters based on coefficient architecture [A] is achieved when it is operated in bit serial fashion. The structure provides hardware minimization for finite impulse response(FIR) filter, infinite impulse response filter(IIR) and for other filters and applications related to combinational logic consisting of delay element(T), multiplier(M), adder and subtractor. Further optimization technique in cluster [D] is done by using common adders (FA) and common subtractor (FS) and using this shared outputs or by using subtractor (FS) instead of adders, when the coefficient value is closer to power of two or by minimizing the use of subtractor by taking common subtraction operator and using adder instead.

Figure 12A:
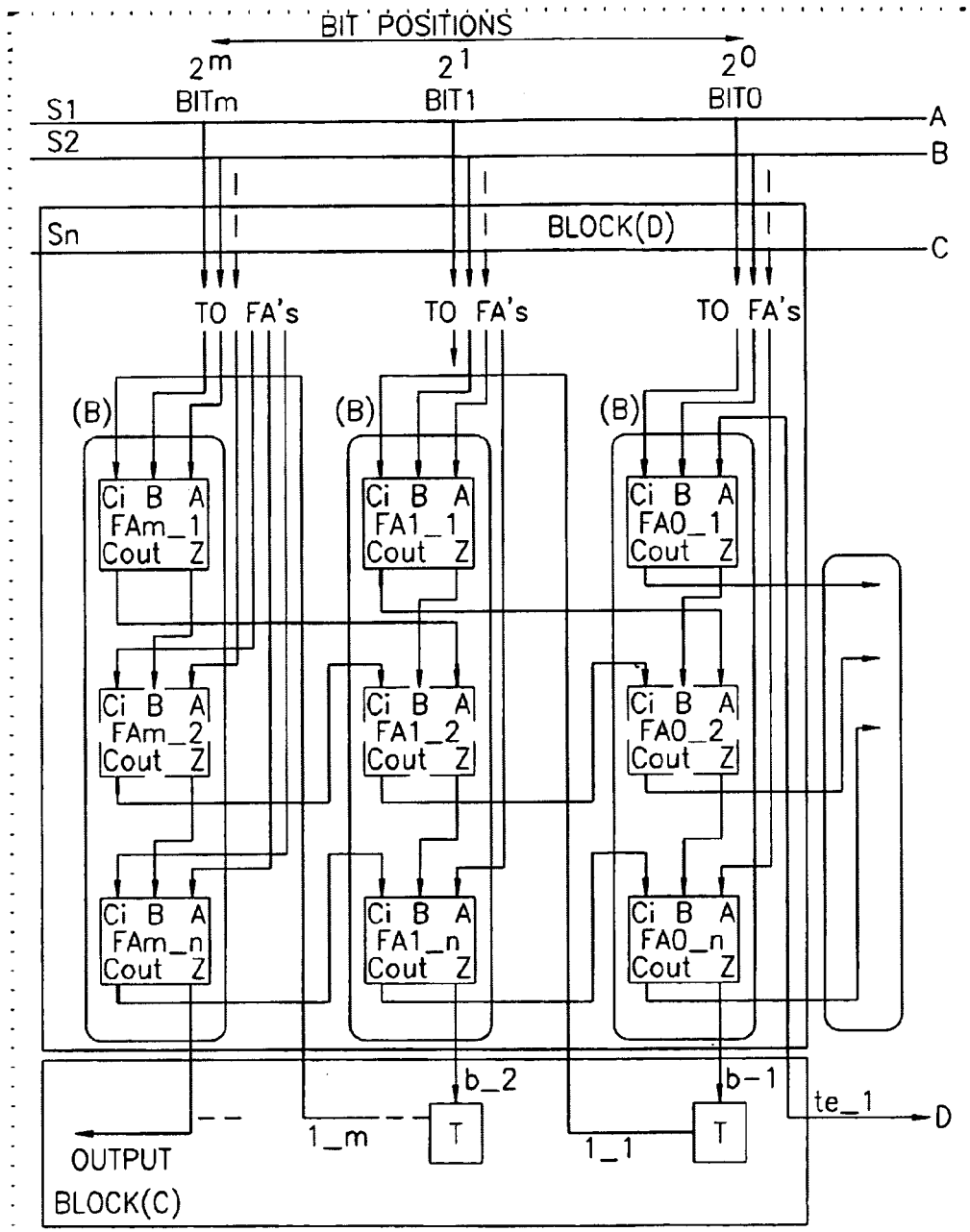
FIGS. 12A–12B show the generalized optimized structure of the present invention.
Figure 12B:
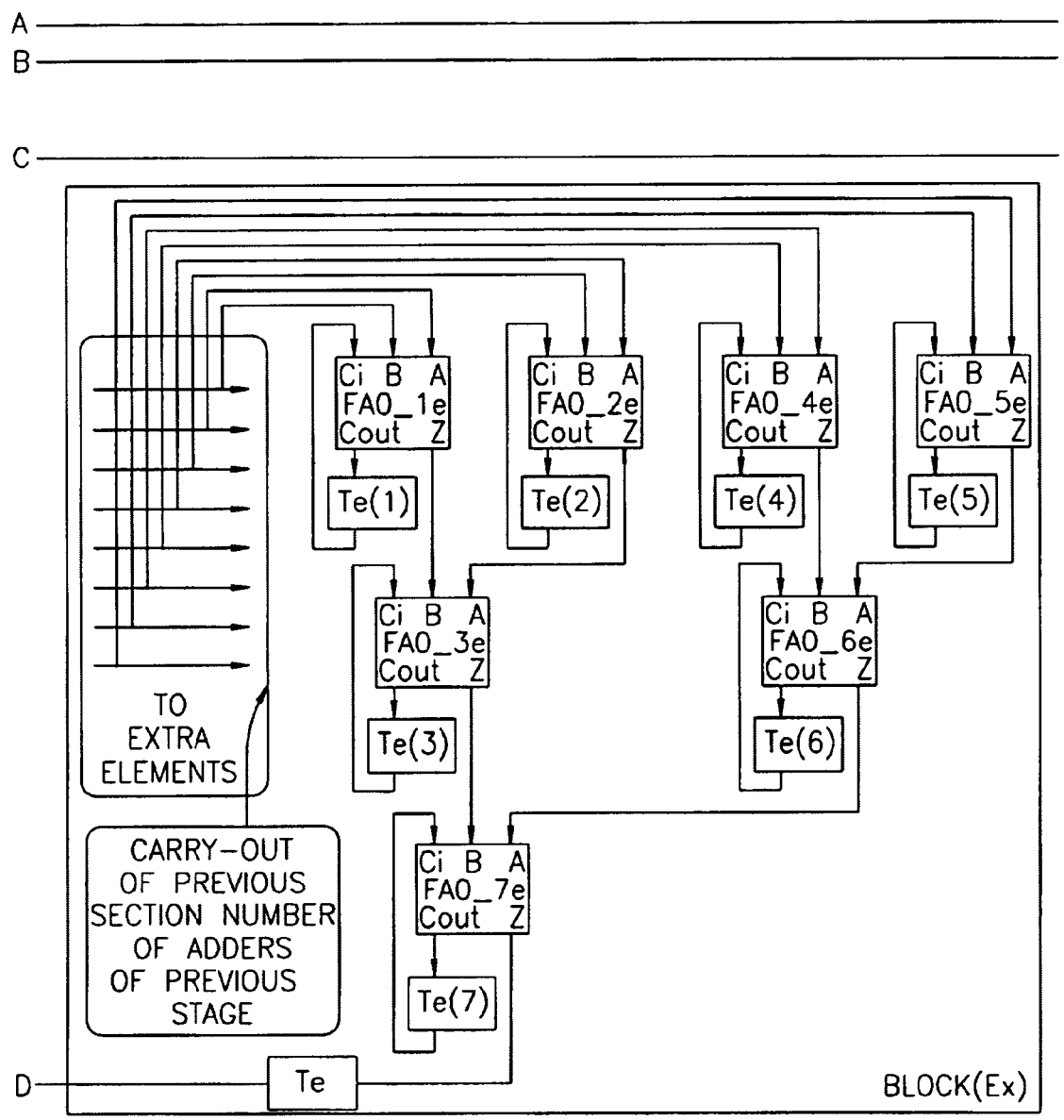

The present device, when used in implementation 2 FIR/IIR filter and similar structure of filters, results in quite area efficient realization of the filter, the storage area in implementations, referred as delay elements [$Z^{-1}$], is smaller as compared to implementation 1 which is present due to inherent property of the structure of implementation 2, and an additional saving in area in filter coefficient realization design is achieved by using the claimed structure of coefficient architecture [A] of "FIG. 12".

In the implementation flow explained under, the carry-out (COUT) pin of full adder (FA) of each stage is fed to (CIN) input of full adder (FA) of previous stage i.e stage preceding the flip-flop (T) element. In this way, Flip-Flop (T1, T2, T3, T4) which is used for multiplication by two, is used again, to function as carry storage and to enable [FA] to perform as one bit serial adder. Rewriting the equation of FIR filter for the example shown in previous section $$y(nT)=(S1+S3)+2*(A1+2*(S1+A1+2*(S2+A2+2*A2)))\qquad\text{(EQ 6)}$$

Using full adder (FA) component in "Equation 6", it is seen that the number of full adders used are the same as the number of one-bit serial adders used in the earlier architecture. In the proposed patent, depending on carryout of BIT0 position, some half adders or some extra elements are present.

Implementation Flow of Equation

Figure 6:
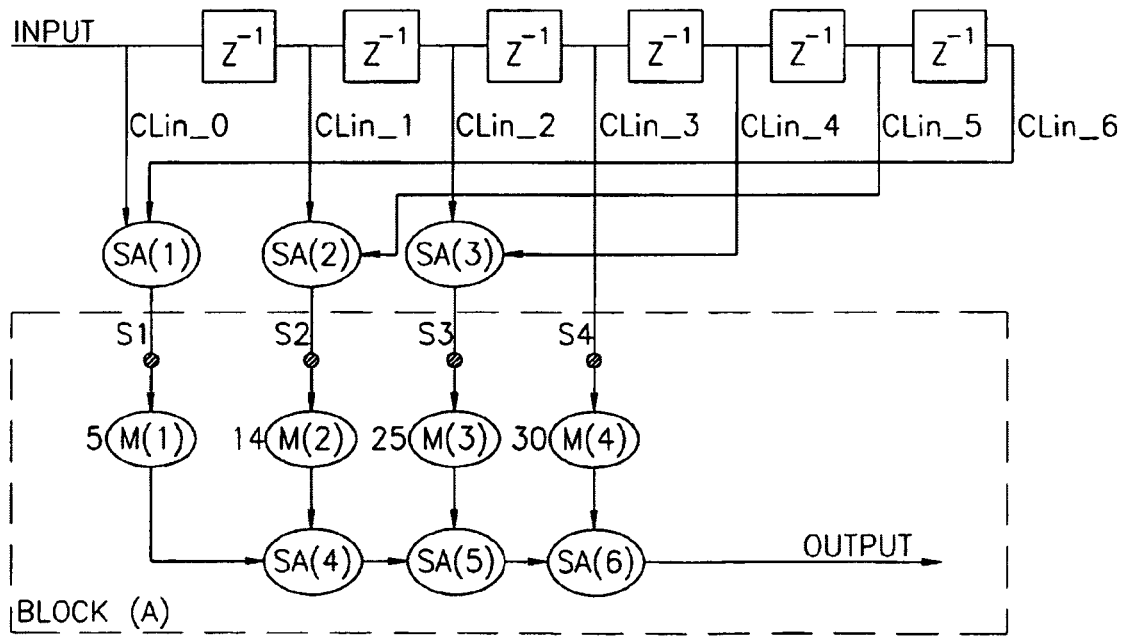
FIG. 6 shows one of the known minimization technique due to symmetry of coefficients.
Figure 11:
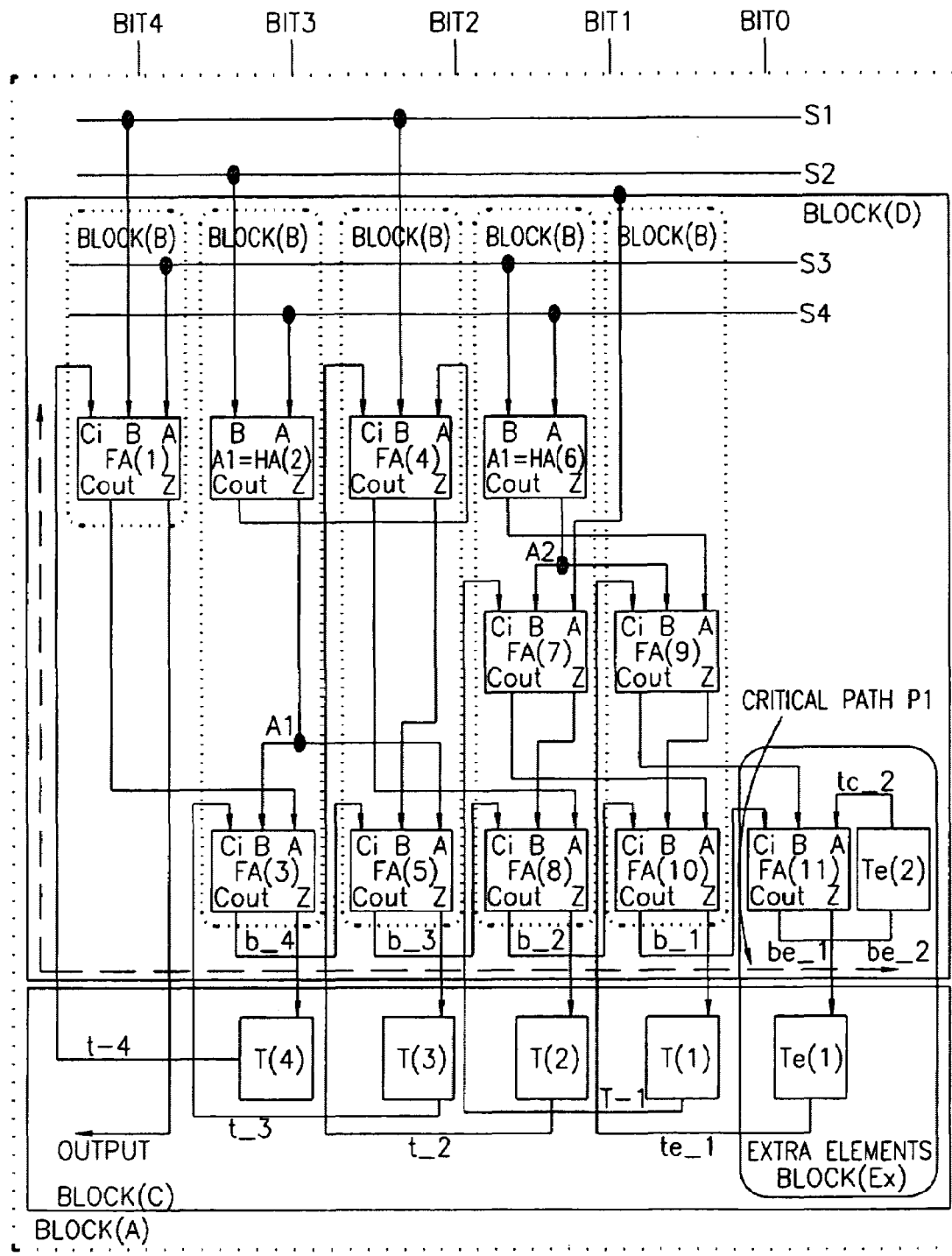
FIG. 11 shows the minimized structure of this example FIR filter, of the present invention.

The implemented structure is shown in "FIG. 11", wherein the input line S1 to S4 represent lines connected to delay block [$Z^{-1}$] through coefficient line Clin_0 to CLin_6 depicted in "FIG. 6" of the drawings. The Lines S1 to S4 are connected to block [B] for performing the serial addition/subtraction for which (FA), (FS) elements are used within block[B]. All [T] elements are represented by block[C].

The adders at all the bit positions [B], represented by FA(1), HA(2), . . . FA(10) are clustered in [D]. The adder [FA]'s inputs is connected from coefficient lines S1, S2, S3, S4 and from unit delay element of previous bit position. The addition/subtraction is performed in [B] block and the final

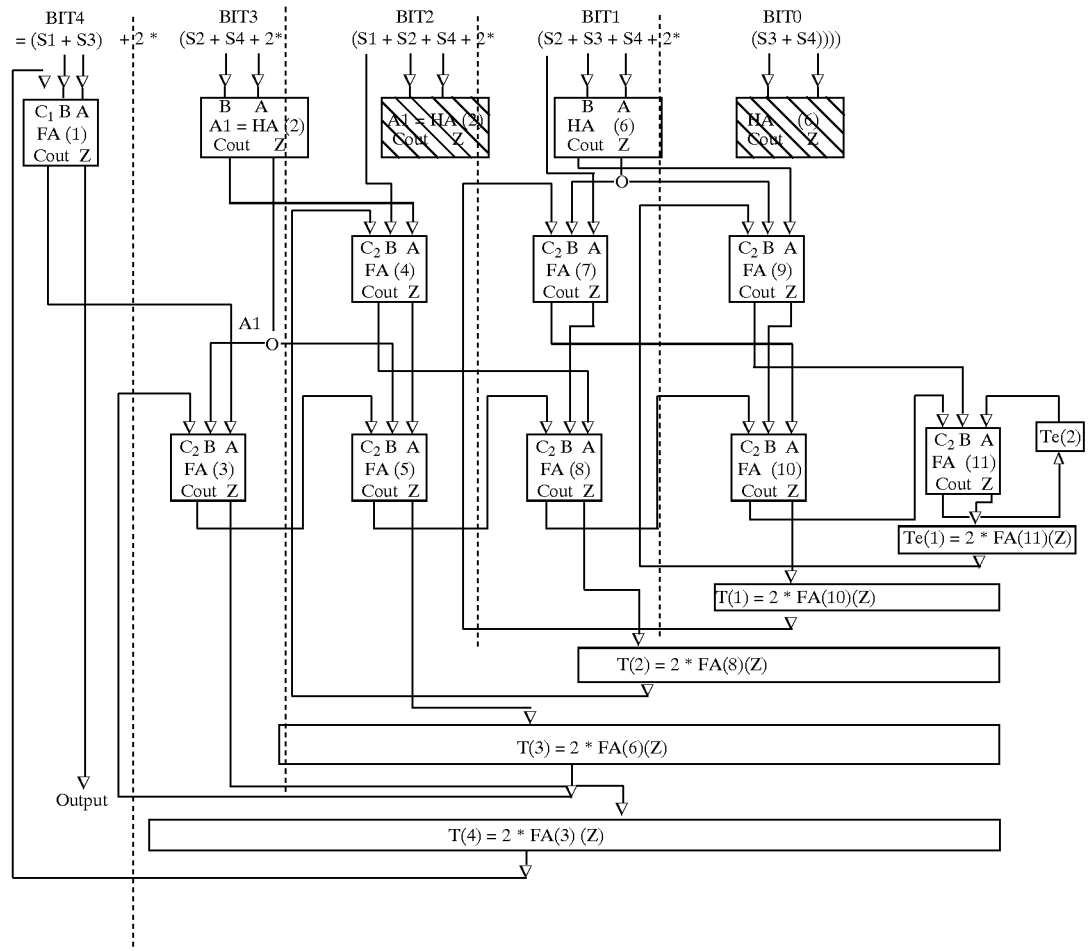

As shown in the above implementation flow, the equation defines the bit position as BIT0 to BIT4, which is the position of "multiplication by power of two". (e.g BIT0 represents multiplication by 20). At BIT0 position addition of S3+S4 is performed and the output is terminated at T(1). The output of T(1) defines the next bit position BIT1, which performs addition of S2+S3+S4 using the [FA] and also the output of T(1). The output of this addition is again terminated at T(2). The structure is repeated in next BIT positions. The carryout of [FA]'s are fed to the previous bit position. The final addition of BIT position BIT4 gives the output of the coefficient block [A].

output of last adder [FA] is connected to [T] elements, which is used for "multiplication by factor of 2". The interconnection from [B] block to [T] block is represented as b_1, b_2, b_3, b_4. The outputs of [T] are connected to one of the inputs of combinational logic of block [B] of next bit position (i.e connected to input of first element (FA) of block [B]. These interconnections of [T] from cluster [C] to [B] is represented as t_1, t_2, t_3, t_4 and Bit positions are marked as BIT0, BIT1, BIT2, BIT3, BIT4. An example illustration of connectivity is explained here. The output b_1 of block [B] which is at bit position BIT0 is fed to the input of the T(1), in turn the output line t_1 of element [T(1)] is fed to next section of block[B]. Thus all addition defines a bit position before getting "multiplied by factor of 2" and charging to next bit position.

The connection of COUT (carryout) of all the [FA] of one stage is explained here. The connection of carry-out (COUT) pin of full adder (FA) of each cluster stage [B] is fed to one of the inputs of full adder (FA) of previous stage cluster [B] i.e stage preceding the flip-flop [T] element of cluster [C]. Thus utilizing the [T] element of that bit position again. This enable using the [T] element for carry storage, by all [FA]'s element in that bit position, during serial addition operation.

In the invention, the flip-flop [T] is used for dual purpose
1) Multiplication of output of block [B] by factor of two, used by all coefficients.
2) Utilizing the same [T] elements commonly by block [B] for using with [FA] to enable it to perform as a serial adder (SA).

For example, at bit position 3, the HA(2) performs addition data on S2, S4 lines The output Z, represents shared adder A1, being fed to FA(3) and FA(5). The output Z of FA(3) defines bit position 3 is terminated at [T(4)] element. The Cout pins at this bit position is connected to Cin of any adder [FA(5)] in previous bit location, hence utilizing the [T(4)] element to enable all the FA's at this location to work as a [SA]. The structure of [SA] is essentially [FA] along with [T] element connecting the Cout of FA to it's Cin pin.

In this implementation, there are some extra elements such as FA(11) and Te(2), Te(1) which are required to terminate the carry out(Cout) at the bit position 0. The number of [FA] elements is equal to the (number of Cout lines-1) in Bit position 0 and the number of [T] elements is equal to the (number of Cout lines) in Bit position 0. The extra elements are represented as [Ex] block.

The circuit is structured into sequential block [C] consisting of [T] elements and combinational Block [D] consisting of FA,FS elements.
a) Block [C] having sequential elements is common for all the coefficients and have share-able elements [T] positioned at end position of each block [B].
b) Block [D] having combinational block[B] which are essentially FA,FS. Not only the hardware within block[B] are share-able but also across various [B] blocks. Hence the components hardware within [D] block is minimized.

Figure 7:
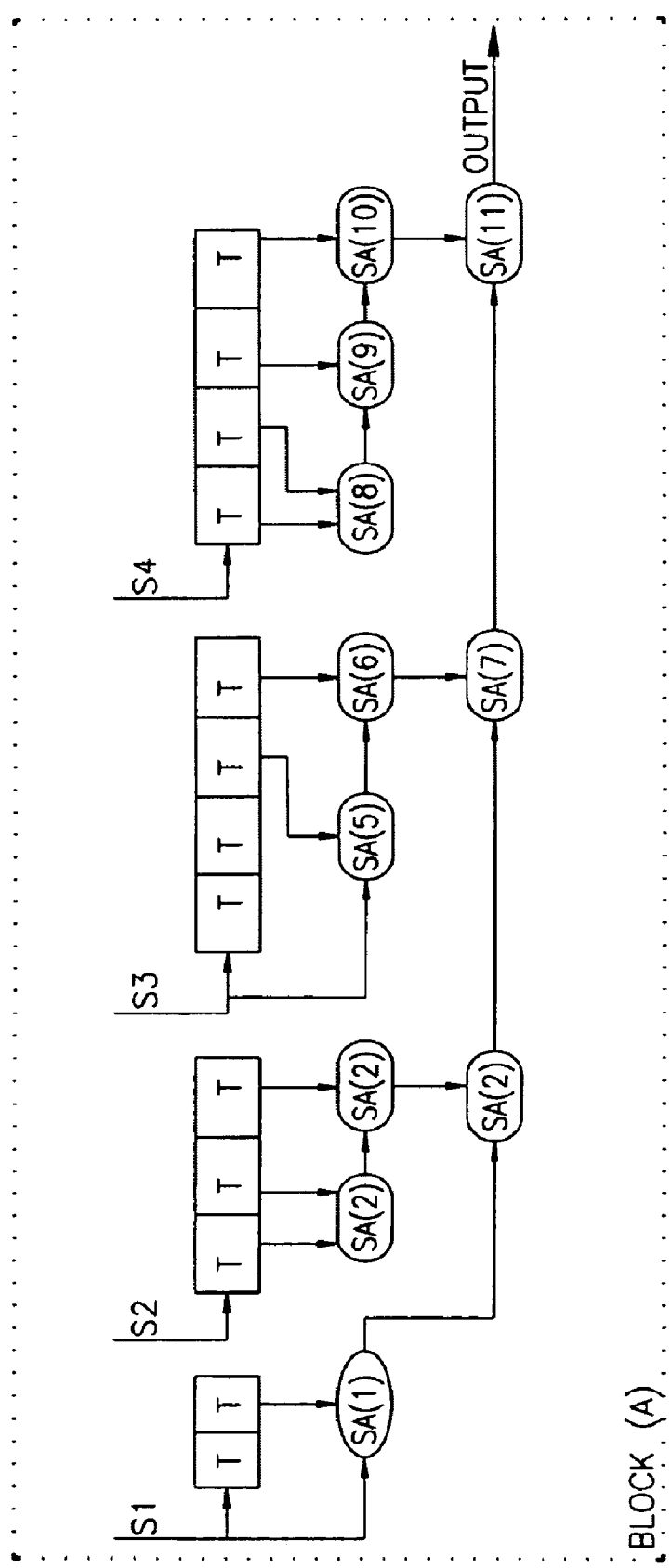
FIG. 7 shows the structure of a prior/known implementation technique for a coefficient block.

The minimization in block[D] is achieved by using following minimization techniques
1) Sharing of common adder term, i.e. utilizing the common adder multiple times.
2) Using subtraction instead of addition when the coefficient is close to power of 2 e.g 63 is better realized as (64−1) than (32+16+8+4+2+1). In former case the number of subtractor is 1 as compared to 5 adders in latter case.
3) Taking common subtraction operation and maximizing the use of adder are applied. This is because subtraction is expensive as compared to addition operation In present minimization of "FIG. 11", approximate area calculations is done as [9 FA+2 HA+6 T=16 Units]. As the applicants have seen that the area in minimization under section "The Existing Method and Minimization" and "FIG. 7" is 35 units. Area in minimization under section "Minimization (Already applied as patent)" ("FIG. 9") is 22 units. Current minimization is an improvement of 54% {(35−16)/35} & 27% {(22−16)/22} of coefficient block respectively over the two structures. (assuming 1 Unit=1 FA=2HA=1T & serial adder=2 Units)

Generalized Structure of the Invention

The invention provides an area efficient realization of filter coefficient block[A] applicable to filters devices such as FIR, IIR and other filter structures based on this block. This architecture is also applicable to combinational and sequential logic consisting of adder, subtractors, multipliers and flip flop [T]. This architecture is realized using the elements fill adders (FA), full subtraction (FS) and flip-flop[T].

Beginning with the generalized equation of FIR filter coefficient block(A)

$$y(nT) = a*S1 + b*S2 + c*S3 + \ldots k*Sn \ldots (1)$$

where a, b, . . . k represents filter coefficients. S1, S2 . . . represents bit lines corresponding to the coefficients.

Now, representing each coefficient as addition of terms arranged in power of two and applying it to the equation.

$$y(nT) = (2^{m}*am + \ldots 2^{1}*a1 + 2^{0}*a0)*S1 + (2^{m}*bm + \ldots 2^{1}*b1 + 2^{0}*b0)*S2 + (2^{m}*cm + \ldots 2^{1}*c1 + 2^{0}*c0)*S3 + \ldots + (2^{m}*km + \ldots 2^{1}*k1 + 2^{0}*k0)*Sn$$

Further talking "2" as common factor we get the generalized equation for architecture under claim as.

$$Y(nT) = (a0*S1 + b0*S2 + \ldots + k0*Sn)$$

$$+2^1 ((a1*S1 + b1*S2 + \ldots + k1*Sn) +$$

$$2^1 ((a2*S1 + b2*S2 + \ldots + k2*Sn) +$$

$$2^1 ((a3*S1 + b3*S2 + \ldots + k3*Sn) + \ldots +$$

$$2^1 ((am*S1 + bm*S2 + \ldots + km*Sn)))))$$

where a0, a1, . . . am and b0, b1, . . . bm and k0, k1, . . . km represents the sign of coefficients [i.e they have value (+/−) 1 or 0]. The architecture realization in "FIG. 12" is done using the sequential elements like unit delays [T] and combinational elements such as full adder (FA) and full subtractor (FS).

In "FIG. 12", the input data is present on bit line S1, S2 . . . Sn. [where n represents the number of coefficients of the filter] The addition terms of the equation. [(a0*S1+b0*S2+ . . . +k0*Sn), (a1*S1+b1*S2+ . . . +k1*Sn) . . . (am*S1+b m*S2+ . . . +km*Sn)] are represented as blocks [B]. Block [B] is a combinational block consisting of full adders (FA) and full subtractor (FS) elements Since the values a0, b0, . . . etc. represents value [(+/−)1 or 0]. The connection of elements (FA/FS) to S1, S2 . . . Sn lines and interconnection of the elements (FA,FS) depend on the value of coefficients [This is because the value of coefficient determines the value of a0, a1, . . . etc. and hence it defines the interconnections between them].

All the addition/subtraction operation at a bit location is performed in block [B] and the output of each block [B] is terminated at [T] elements, which are essentially used to multiply the block [B] output by "a factor of two" and passing the output to next bit position. {The elements T[1], T[2], . . . T[m] are used for this}. The connections (b_1, b_2, . . . b_m) are used for termination of output of block [B]. The bit positions of serial data frame are marked as BIT0, BIT1, . . . BITm. The number of [T] elements depends on the size of maximum coefficient and is shareable for all the coefficient in the coefficient block [A]. Also all the elements [B] are clustered together as [D] and all the unit delay elements {T[1], T[2] . . . T[m]} are clustered together in [C]. Thus separating the sequential and combinational logic. The input of the unit delay element [T] is final output of block [B] and the output of element [T] is connected to the one of the inputs of combinational logic of block [B] of next bit position (i.e connected to input of first element (FA or FS) of block [B] depending upon the sign value+/−). The interconnections from cluster [C] to [B] is represented as t_1, t_2 . . . t_m.

Thus, the [T] elements clustered as [C] is share-able for all the coefficients and the full adder/subtractor (FA/FS) components are clustered as [D]. The carry-out pin of full adder (FA) of each cluster stage [B] is fed to input of full adder (FA) of previous stage cluster [B] i.e stage preceding the flip-flop (T) element of cluster [C]. In this way, we will share the same Flip-Flop [T] which is used for multiplication by factor of two (T1, T2, T3 . . . Tn) to the implementation of the carry structure in the one bit serial adder.

Extra components represented as [Ex] block are used for connecting the carry-out of all the adders/subtractors (FA/FS) of last stage of [D] i.e bit position BIT0. Full adders/full subtractor [FA/FS] and unit delays [T] are used in this block. The line COUT (carryout) of bit position BIT0 is connected to [Ex] block (typically to inputs of element such as [FA] or [FS]}. Now using a [T] element, the carryout (COUT) of each one of [FA/FS] is fed to the CIN of the same element. Also, for connection of Z of [FA]'s to the input A or B of next [FA] element. A binary tree can be formed here. The number of [FA], [T] elements in [Ex] block are [number of carryout pins −1] and [number of carryout pins] respectively.

In the invention, optimizations in hardware in both cluster [C] and [D] is achieved with the reduced unit delays [T] and the adder/subtractor area (FA,FS). The gain in hardware is explained below.

Hardware Reduction in Block [C]

For filter having large size coefficient, this structure reduces the area of coefficient block [A] [by 50-75% of the area of coefficient block [A]). Before beginning to prove the statement, the calculation of elements is formularize for 1) number of flip-flop (T)
2) number of serial adders (SA) or full adders (FA)

Figure 8:
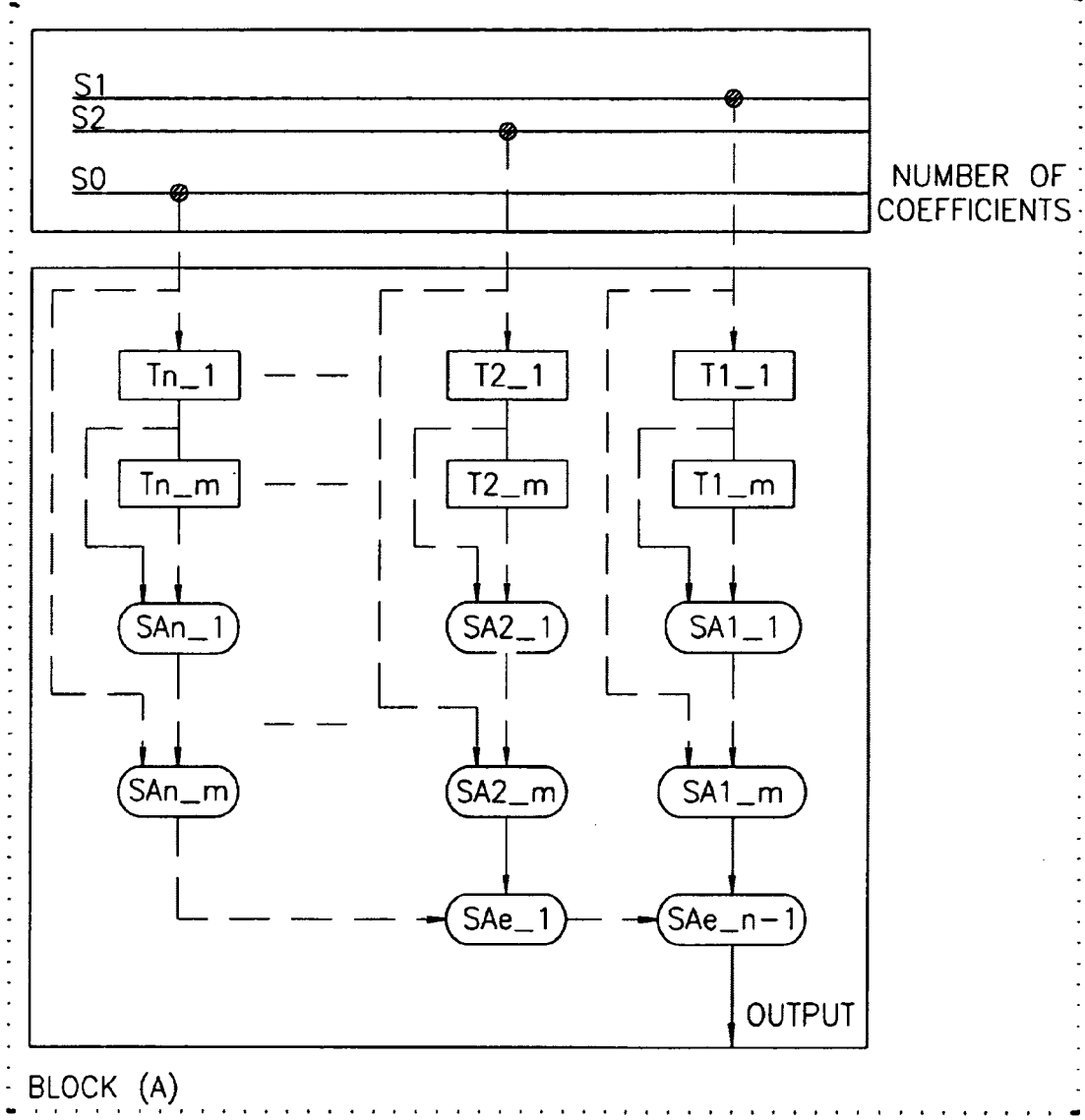
FIG. 8 shows the generalized structure of a prior/known implementation technique for a coefficient block.
Figure 10:
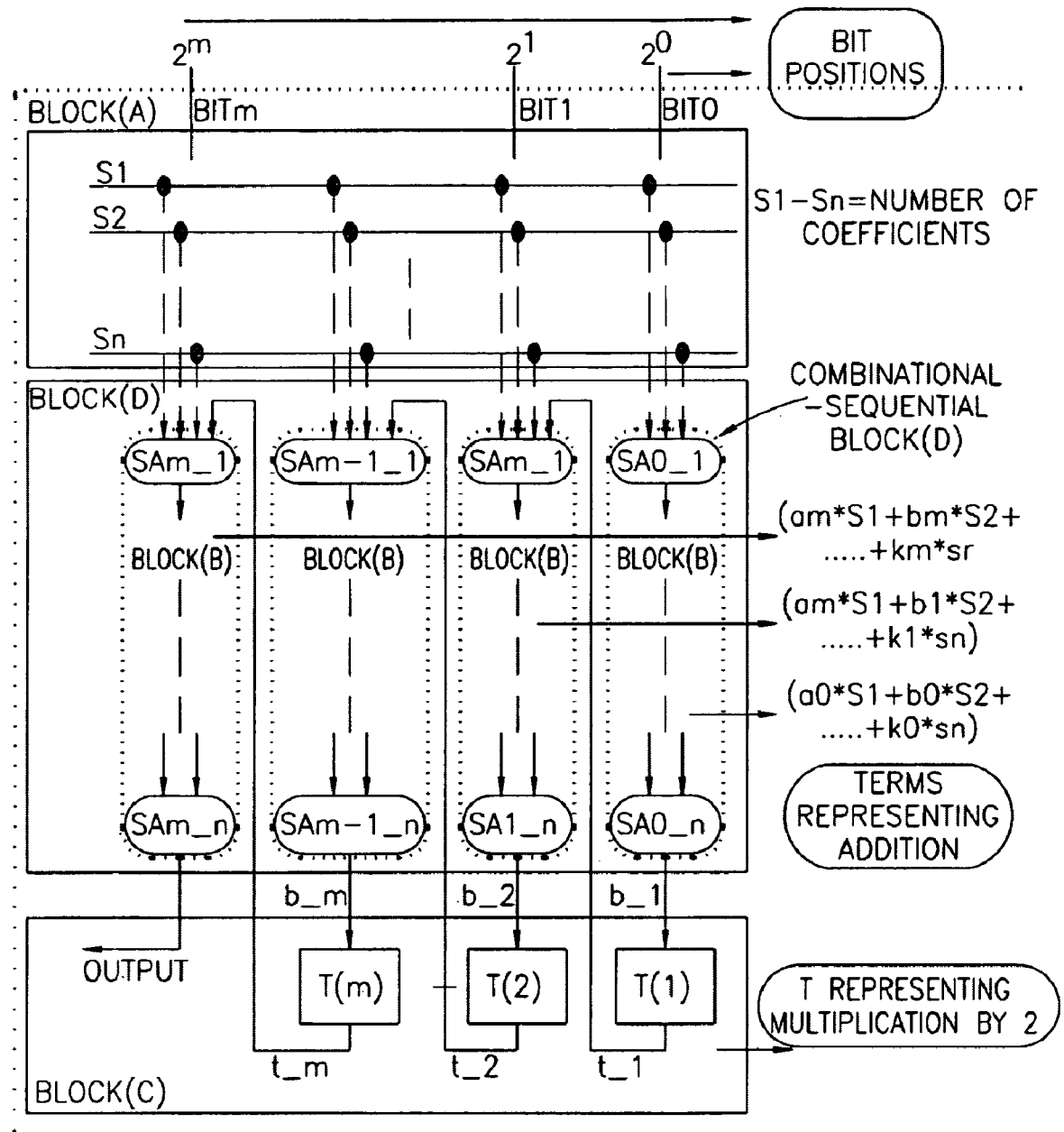
FIG. 10 shows the generalized structure of the minimization technique involved in the FIR filter.

This comparison is done here. The generalized structure of "The Existing Method and Minimization" in illustrated in "FIG. 8". The other structure for comparison are "Minimization (Already applied as patent)" in "FIG. 10" and "Generalized structure of the invention" in "FIG. 12" of the drawings.

1) The number of flip-flops [T] elements in the coefficient block depends on the size of all the coefficients. The approximate and pessimistic formula for calculation of total flip-flops (T) in coefficient block in "The Existing Method and Minimization" is [=average size of coefficient*number of coefficient] ("FIG. 8"), where average size of coefficient is calculated pessimistically as (Maximum coefficient size/2). While in the "Minimization (Already applied as patent)" and "Proposed Minimization (Proposal for Patent)" the number of [T] elements are [=maximum size of coefficient, since the flip-flops (T) are share-able here].

2) The approximate formula for calculation of total adders (SA) in coefficient block for the mentioned above cases is [=adders per coefficient*number of coefficient]. Adders per coefficient block solely depend on value of coefficient. Assuming no optimization in worst case, number of adders per coefficient is (=number of coefficient*maximum coefficient size/2).

Now using the mentioned formula on an example filter having 20 coefficient. The coefficient having maximum value is in 16 bits (e.g. maximum coefficient value is +32767 or −32768 in 2's complement representation). In the present example, average size of the coefficient approximated by the formula is 8 bit. For "The Existing Method and Minimization", total number of flip-flop (T) required for implementation is 8*20=160. In contrast to this, "Minimization (Already applied as patent)" and "Proposed Minimization (Proposal for Patent)" would require only 16 Flip-Flops (The number of flip-flops of all the coefficients are share-able and are limited to the coefficient which has the maximum value). Using the formula for adder's calculation, the number of adders for three cases are 8*20=160 (approx.).

Area calculation for "The Existing Method and Minimization" is 160 T+160 SA=480 units. Area calculation for "Minimization (Already applied as patent)" is 16 T+160 SA=336. Area calculation for "Proposed Minimization (Proposal for Patent)" is 16 T+160 FA+(extra elements 8T+7 FA)=191. [Assuming that average number of full adder per bit position is 8. We will generalize the calculation of number of extra elements here. These extra elements are needed to terminate the carry-out of last (LSB) position. Thus if the average number of FA's is 8, the extra elements (7 FA, 8T) are needed to terminate the carry-outs' of LSB position. This is shown in "FIG. 12"]. Thus we see that current proposal has an area improvement of approximately by 60% {(480−190)/480} of coefficient block over "The Existing Method and Minimization".

Hardware Reduction in Block [D]

For hardware reduction in block [D], following minimization are applied.
1) sharing of common adder term and using it in block [D]
2) using subtraction instead of addition when the coefficient is close to power of 2 e.g 63 is better realized as (64−1) than (32+16+8+4+2+1)
3) Taking common subtraction operation and maximizing the use of adder For approximate area calculation following assumption is made (1 Unit of Area=1 FA=2HA=1T & SA=SS=2 Units of Area).

Advantages Involved in the Present Invention

The Area gets reduced by 50–75% (of the coefficient block[A]) for big filter structures, if all the 3 optimization steps, as discussed in previous section "Hardware reduction in block [D]", are applied.

Figure 13:
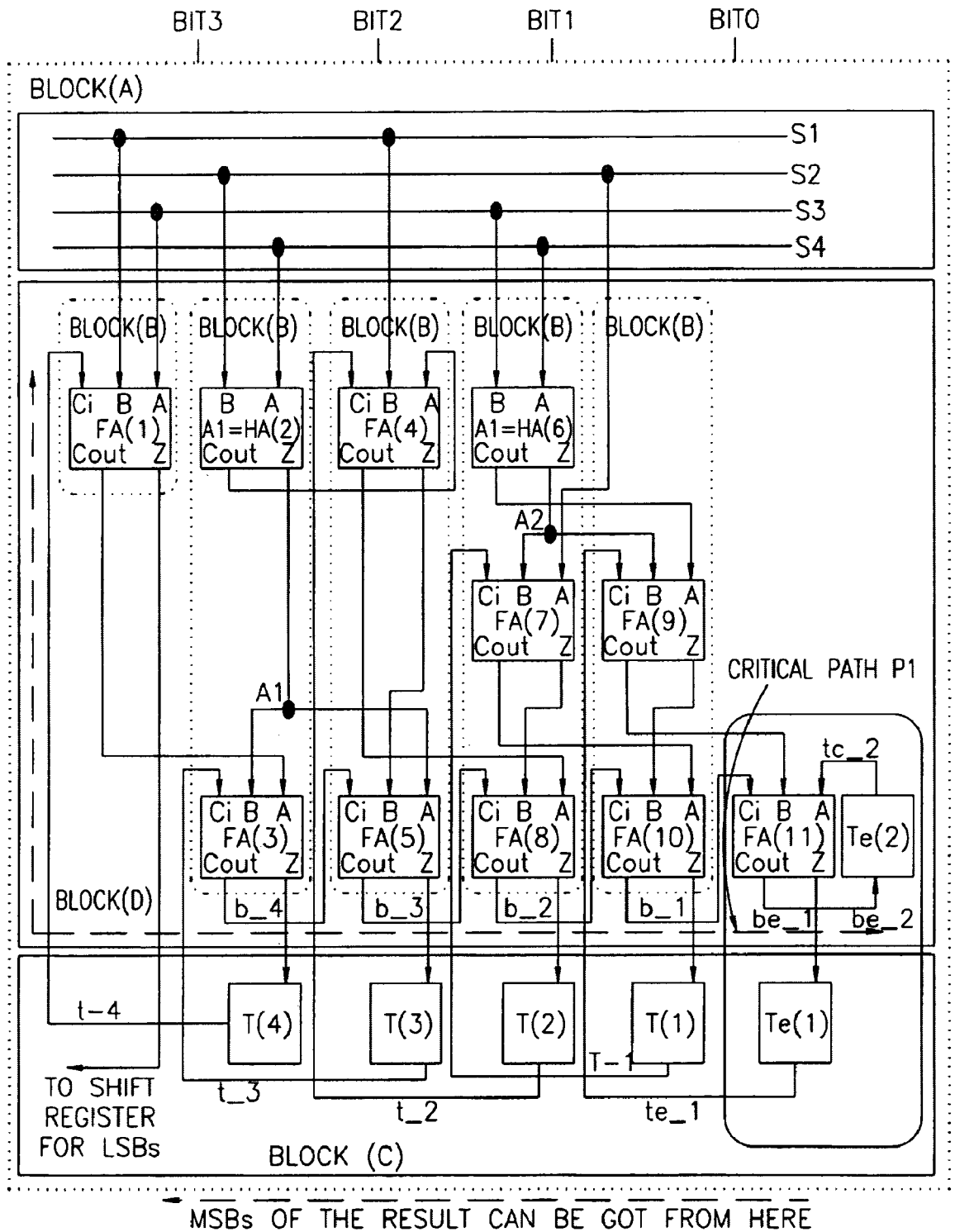
FIG. 13 shows the other advantage of the structure, i.e., getting the parallel output directly, of the present invention.

The last proposed architecture ("FIG. 12") is a proper Mealy type machine. Many a times, the output has to be converted back to parallel data format. In that case, the outputs from the same shift registers can be used ("FIG. 13"). One bit-serial multipliers could be still multiplexed for the proposed architecture if the specifications permit (i.e. if the frequency of operation is not very high.)

What is claimed is:

1. A filter device, comprising:
a plurality of delay blocks;
a plurality of coefficient lines coupled respectively to the delay blocks;
a logic architecture that includes:
serial input bit lines S1, S2, . . . Sn coupled to the plurality of coefficient lines, n representing a number of coefficients of a filter transfer function; and
m combinational logic blocks having full adder elements and providing addition terms of the filter transfer function [(a0*S1+b0*S2+ . . . +k0*Sn), (A1*S1+b1*S2+ . . . +k1*Sn) . . . (am*S1+bm*S2+ . . . +km*Sn)], where a0, b0 . . . k0, a1, b1 . . . k1, am, bm, . . . km are coefficients having values of +/−1 or 0; wherein the full adder elements have respective first inputs, second inputs, and third input, the first inputs of the full adder elements being connected to the serial input bit lines S1, S2 ... Sn and to each other depending on the coefficients a0 ... km; wherein each full adder element includes a carry-out pin coupled to the third input of one of the full adder elements of a previous one of the combinational logic blocks; wherein the combinational logic blocks include respective output lines b_1, b_2, ... b_m, and the output line b_m provides a final output of the architecture; and a sequential logic cluster having a plural number of delay elements depending on a size of a maximum coefficient value of the filter transfer function, each delay element having an input coupled to a respective one of the output lines of the combinational logic blocks and an output coupled to the second input of one of the full adder elements of a respective combinational logic block corresponding to a next bit position, wherein the delay elements are respectively positioned adjacent to respective end positions of respective combinational logic blocks.

2. The device as claimed in claim 1 wherein when operated in bit serial fashion, the device provides hardware minimization of a finite impulse response filter.

3. The device as claimed in claim 1 wherein one of the combinational logic blocks includes a full subtracter element when a coefficient value of the filter transfer function is close to a power of two.

4. The device as claimed in claim 1 wherein the architecture includes a common subtraction operator that operates with the full adder elements to minimize the use of full subtracter elements.

5. The device as claimed in claim 1 wherein a first one of the coefficient lines is directly connected to a common input line, the delay blocks are sequentially connected to the common input line, and the remaining coefficient lines are coupled respectively to respective outputs of the delay blocks.

6. A serial bit, finite impulse response (FIR) filter device including:
   a logic block that receives an (m+1)-bit input and produces a transfer function output corresponding to an $m^{th}$ bit position, the logic block including:
      a combinational-sequential logic block that receives filter transfer function coefficients of a predetermined filter transfer function, the combinational-sequential logic block including m+1 combinational logic blocks B0, B1, ... Bm; and
      a sequential logic block having m delay elements for receiving respective outputs of the combinational logic blocks B0, B1, ... Bm−1 and for providing delayed outputs to respective inputs of the combinational logic blocks B1, B2, ... Bm, respectively;
      wherein each combinational logic block includes a plurality of serial subtractor or adder elements for providing a coefficient multiplication function for each the combinational logic block;
      wherein the combinational logic block Bm outputs said transfer function output according to said filter transfer function, based on said (m+1)-bit input; and
      wherein each sequential subtractor or adder element includes a carry-out pin fed to an input of one of the sequential subtractor or adder elements of a previous one of the combinational logic blocks.

7. A digital filter device comprising:
   a coefficient circuit having n input bits corresponding to n filter coefficients;
   a combinational circuit comprising a plurality of full adders with the interconnection of the plurality of full adders depending on values of the n coefficients to implement the addition terms of the filter transfer function; and
   a sequential circuit comprising a predetermined number of unit delays with the predetermined number being dependent on a maximum value of the n coefficients, the inputs of the unit delays being coupled to output of selected ones of the full adders and the output of the unit delays being coupled to an input of one of the full adders of the combinational circuit in following bit position from the corresponding unit delay, wherein each of the full adders includes a carry-out pin fed to an input of one of the full adders in a previous bit position.

8. The filter device of claim 7 wherein the combinational circuit implements the addition terms of the filter transfer function using the following form:

(a0*S1+b0*S2+ ... +k)*Sn), (a1*S1+b1*S2+ ... +k1*Sn),

...

(am*S1+bm*S2+ ... +km*Sn)], where S1, S1, Sn are the input bits and
a0, b0 ... k0, a1, b1 ... k1, am, bm, ... km each has a value of +/−1 or 0.

9. The filter device of claim 7 wherein the coefficient circuit receives n serial input bits.

10. The filter device of claim 7 wherein the combinational circuit and the sequential circuit are interconnected to implement a finite input response (FIR) filter.

11. The filter device of claim 7 wherein the combinational circuit and the sequential circuit are interconnected to implement an infinite input response (IIR) filter.

* * * * *